(12) United States Patent
Kota et al.

(10) Patent No.: US 8,668,805 B2
(45) Date of Patent: Mar. 11, 2014

(54) LINE END SHORTENING REDUCTION DURING ETCH

(75) Inventors: Gowri Kota, Fremont, CA (US); Frank Y. Lin, Fremont, CA (US); Qinghua Zhong, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1605 days.

(21) Appl. No.: 12/165,539

(22) Filed: Jun. 30, 2008

(65) Prior Publication Data

US 2008/0268211 A1 Oct. 30, 2008

Related U.S. Application Data

(62) Division of application No. 11/521,810, filed on Sep. 14, 2006, now Pat. No. 7,407,597.

(51) Int. Cl.
*C23F 1/00* (2006.01)
*H01L 21/306* (2006.01)

(52) U.S. Cl.
USPC .................................................. 156/345.26

(58) Field of Classification Search
USPC ............... 118/715, 722, 723 R, 723 I, 723 E; 156/345.24, 345.26, 345.38, 156/345.43–345.48
See application file for complete search history.

(56) References Cited

U.S. PATENT DOCUMENTS

| | | | |
|---|---|---|---|
| 5,959,325 A | 9/1999 | Adair et al. | |
| 6,184,151 B1 | 2/2001 | Adair et al. | |
| 6,553,560 B2 | 4/2003 | Ma et al. | |
| 6,653,231 B2 | 11/2003 | Okoroanyanwu et al. | |
| 6,793,832 B1 | 9/2004 | Saito et al. | |
| 6,794,230 B2 | 9/2004 | Huang et al. | |
| 6,859,918 B2 | 2/2005 | Ma et al. | |
| 6,916,594 B2 | 7/2005 | Bok | |
| 6,946,400 B2 | 9/2005 | Chung | |
| 7,125,496 B2 | 10/2006 | Lee | |
| 7,344,991 B2 | 3/2008 | Balasubramaniam et al. | |
| 2001/0018252 A1 | 8/2001 | Park et al. | |
| 2002/0192976 A1 | 12/2002 | Trapp et al. | |
| 2004/0009436 A1 | 1/2004 | Lee et al. | |
| 2004/0132225 A1* | 7/2004 | Chung et al. ............... | 438/22 |

(Continued)

FOREIGN PATENT DOCUMENTS

CN 1717778 A 1/2006

OTHER PUBLICATIONS

Examination Report dated May 11, 2011 from Singapore Patent Application No. 200904499-1.
Office Action dated Nov. 5, 2007 from U.S. Appl. No. 11/521,810.

(Continued)

*Primary Examiner* — Maureen Gramaglia
(74) *Attorney, Agent, or Firm* — Beyer Law Group LLP

(57) ABSTRACT

A semiconductor device may be formed by the method comprising providing a patterned photoresist mask over the etch layer, the photoresist mask having at least one photoresist line having a pair of sidewalls ending at a line end, placing a coating over the at least one photoresist line comprising at least one cycle, wherein each cycle comprises: a) depositing a polymer layer over the photoresist line, wherein an amount of polymer at the line end is greater than an amount of polymer on the sidewalls, and b) hardening the polymer layer, and etching features into the etch layer through the photoresist mask, wherein a line end shortening (LES) is less than or equal to 1.

7 Claims, 9 Drawing Sheets

(56) References Cited

U.S. PATENT DOCUMENTS

| | | |
|---|---|---|
| 2005/0009358 A1* | 1/2005 | Choi et al. .................. 438/706 |
| 2006/0281030 A1 | 12/2006 | Lin et al. |
| 2006/0292877 A1 | 12/2006 | Lake |
| 2007/0048675 A1 | 3/2007 | Chang et al. |

OTHER PUBLICATIONS

Notice of Allowance dated Apr. 4, 2008 from U.S. Appl. No. 11/521,810.

Search Report dated Sep. 28, 2010 from Singapore Patent Application No. 200904499-1.

Written Opinion dated Sep. 28, 2010 from Singapore Patent Application No. 200904499-1.

International Search Report dated Jun. 9, 2008 from International Application No. PCT/US2008/050524.

Written Opinion dated Jun. 9, 2008 from International Application No. PCT/US2008/050524.

Office Action dated Apr. 30, 2010 from Chinese Application No. 200880002066.7.

Office Action dated Nov. 2, 2010 from Chinese Application No. 200880002066.7.

* cited by examiner

LINE END SHORTENING REDUCTION DURING ETCH

CROSS REFERENCE TO RELATED APPLICATIONS

This application claims priority to U.S. patent application Ser. No. 11/521,810 filed on Sep. 14, 2006, now U.S. Pat. No. 7,407,597, entitled "LINE END SHORTENING REDUCTION DURING ETCH", which is incorporated by reference herein for all purposes.

FIELD OF INVENTION

The present invention relates to the formation of semiconductor devices. More particularly, the present invention relates to reducing line end shortening during the formation of semiconductor devices.

BACKGROUND OF THE INVENTION

During semiconductor wafer processing, features of the semiconductor device are defined in the wafer using well known patterning and etching processes. In these processes, a photoresist (PR) material is deposited on the wafer and is then exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

The minimum feature size of integrated circuits (ICs) continues to shrink with each generation of semiconductor wafer processing improvements. As transistors and metal lines get smaller and move closer together, previously insignificant third-order variables now dominate IC design and fabrication. One problem that has arisen is "line end shortening" (LES). FIGS. 1A and 1B illustrate one line end shortening problem. LES is characterized as the difference between the actual printed position of the end of a line and the intended (designed) position. FIG. 1A illustrates the design of a transistor 10 with a polysilicon line 12 running from left to right, that may form a gate region used to electrically couple an upper diffusion region with a lower diffusion region.

FIG. 1B illustrates the actual printed image that results from the design with the dotted lines 16 illustrating the desired design. Due to the etch effects and photoresist pullback, there is a significant amount of line end shortening 14. An LES ratio may be defined, with reference to FIG. 1B, as $(Y-Y_1)/(X-X_1)$ which is currently greater than 2.

FIGS. 2A and 2B illustrate another LES problem. The design illustrated in FIG. 2A may have a photoresist line 20 having a width $W_1$, side walls 24, and line ends 22 between an active source 26 and drain 28. The resulting printed image is illustrated in FIG. 2B. The resulting image has a photoresist line 30 with a width $W_2$, sidewalls 32, and line ends 34. The width, $W_3$, between the design line end 22 and the printed image line end 34 results in a gap between the source 26 and drain 28 that causes leakage and failure of the device. As stated above, and illustrated in FIG. 2B, LES at $W_3$, is much greater than the difference between $W_1$ and $W_2$. Thus, LES is greater at the line ends 22 as compared to the sidewalls 24. Although extensions may be added to the line to print a longer photoresist line, it is typically not possible because there is not enough room in the mask design to compensate for LES. The LES ratio may be defined as $(2 \cdot W_3)/(W_1-W_2)$.

Others have added "hammer heads" onto line ends to compensate for LES. However, hammer heads may give rise to the design rule violations that can potentially cause bridging between the hammer head and polysilicon line. Although this bridging problem may be alleviated by a separation between the hammer head and polysilicon lines, the separation would increase the size of the circuit element, which means fewer circuit elements that can be integrated into a semiconductor device. Additionally, the use of hammer heads may cause larger line width roughness.

LES may result in degraded device performance, reduced reliability, lost yield, leakage in the device, limitations on critical dimensions (CD) and other related problems.

SUMMARY OF THE INVENTION

To achieve the foregoing and in accordance with the purpose of the present invention a method for etching a feature in an etch layer is provided. An apparatus for etching a feature in an etch layer, below a photoresist mask, having at least one photoresist line having a pair of sidewalls ending at a line end is provided. A plasma processing chamber has a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source in fluid connection with the gas inlet comprises a polymer deposition gas source, a hardening gas source, and an etch layer etch gas source. A controller may be controllably connected to the gas source. The at least one electrode comprises at least one processor and computer readable media comprising computer readable code for reducing the shrinkage of the sidewalls and the line ends of the photoresist line, comprising at least one cycle, wherein each cycle comprises computer readable code for depositing a polymer layer over the photoresist line, wherein an amount of polymer at the line ends is greater than an amount of polymer on the sidewalls, computer readable code for hardening the polymer layer, computer readable code for etching the etch layer, wherein a line end shortening (LES) is less than or equal to 1, and computer readable code for removing the photoresist mask.

A semiconductor device may be formed by the method comprising providing a patterned photoresist mask over the etch layer, the photoresist mask having at least one photoresist line having a pair of sidewalls ending at a line end, placing a coating over the at least one photoresist line comprising at least one cycle, wherein each cycle comprises: a) depositing a polymer layer over the photoresist line, wherein an amount of polymer at the line end is greater than an amount of polymer on the sidewalls, and b) hardening the polymer layer, and etching features into the etch layer through the photoresist mask, wherein a line end shortening (LES) is less than or equal to 1.

Another manifestation of the invention provides for a semiconductor device formed by the method for reducing line end shortening of a photoresist mask having at least one photoresist line having a pair of sidewalls ending at a line end, comprising depositing a polymer layer over the photoresist line, wherein an amount of polymer at the line end is greater than an amount of polymer on the sidewalls, hardening the polymer layer, and etching features into an etch layer through the photoresist mask, wherein a line end shortening (LES) is less than or equal to 1.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 2A and 2B illustrate another line end shortening problem.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
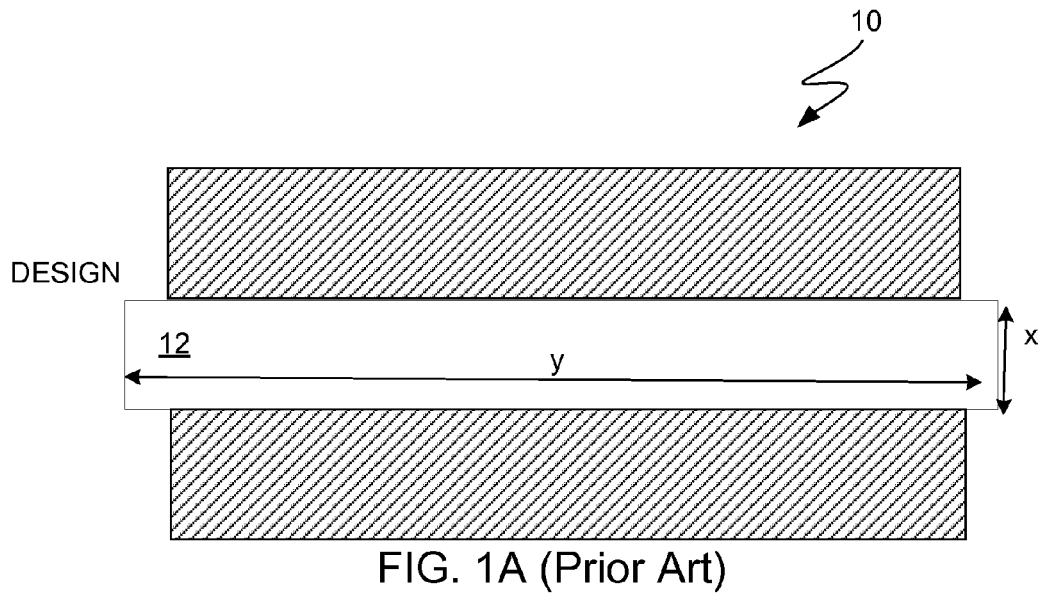
FIGS. 1A and 2B illustrate one line end shortening problem.
Figure 1B:
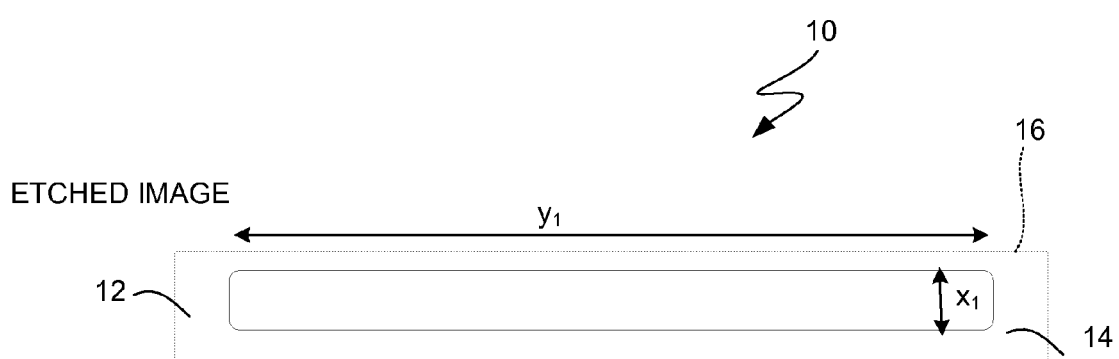
Figure 2A:
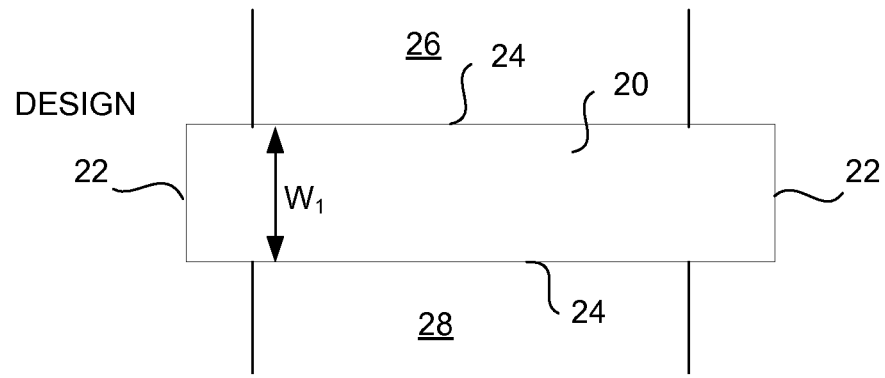
Figure 2B:
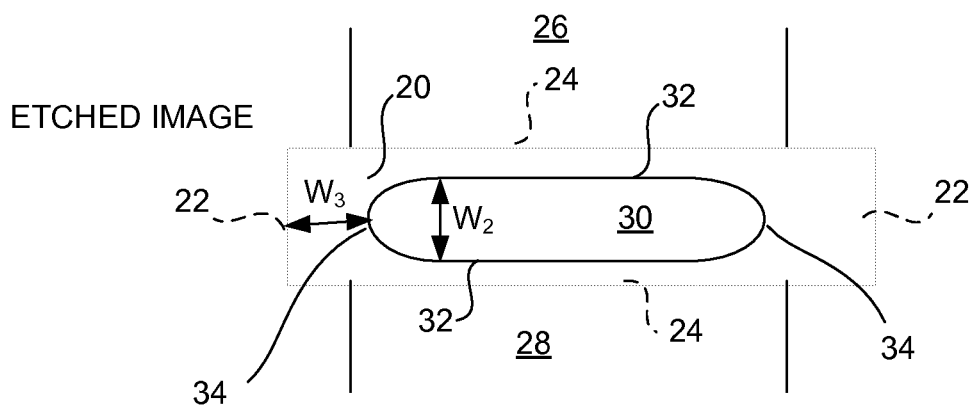
Figure 3:
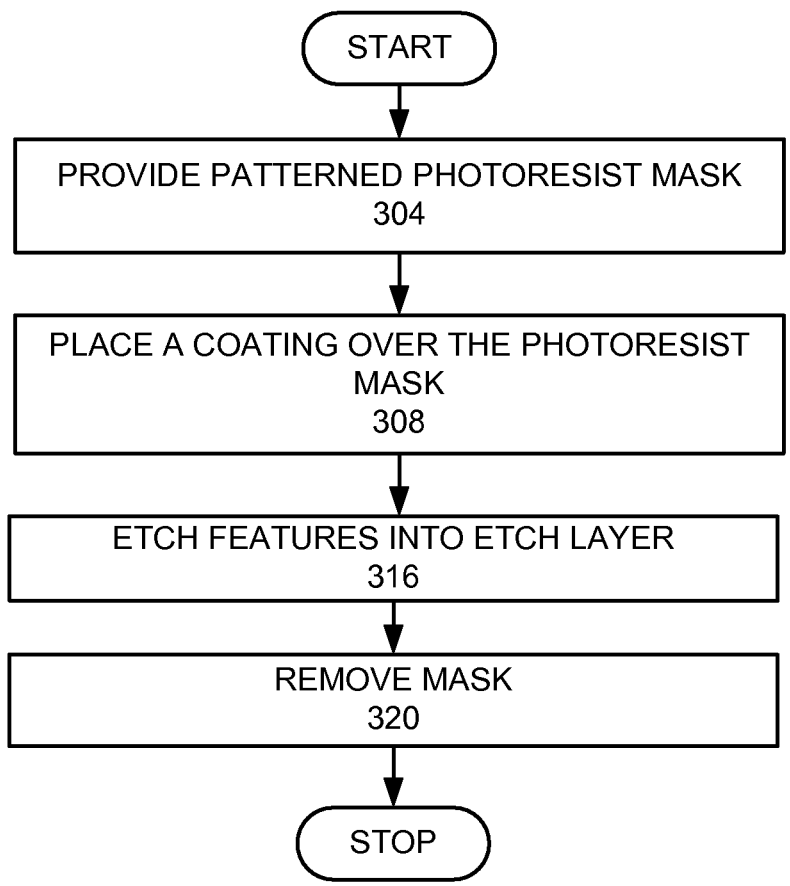
FIG. 3 is a high level flow chart of a process that may be used in an embodiment of the invention.
Figure 4A:
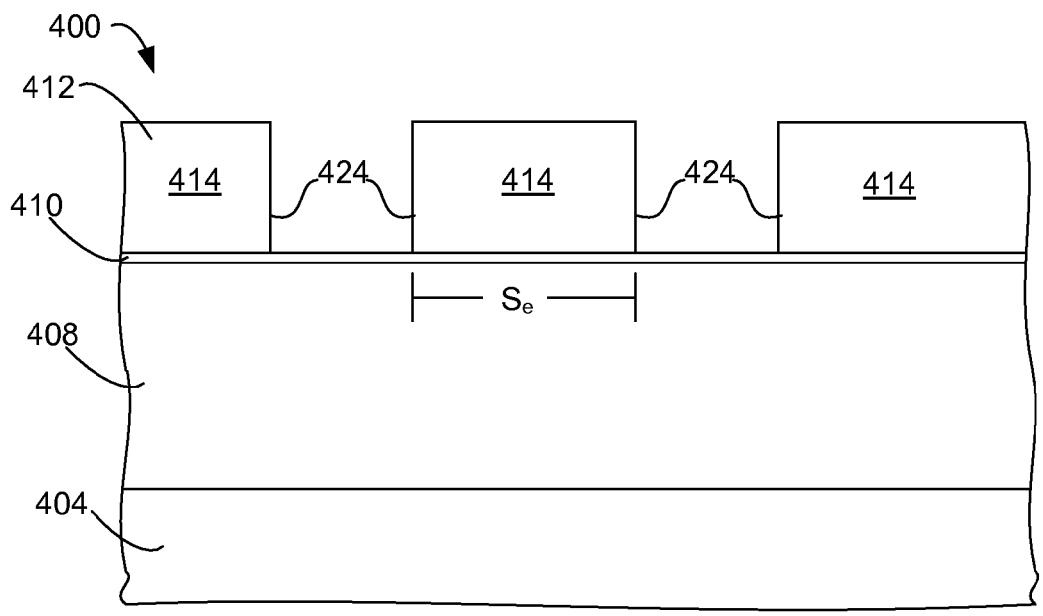
FIGS. 4A-F are schematic cross-sectional and top views of a stack processed according to an embodiment of the invention

To facilitate understanding, FIG. 3 is a high level flow chart of a process that may be used in an embodiment of the invention. A patterned photoresist mask is provided (step 304). FIG. 4A is a schematic cross-sectional view of a layer to be etched 408 over a substrate 404, with a patterned photoresist mask 412 with photoresist features 414, over an underlayer 410, over the layer 408 to be etched forming a stack 400. The patterned photoresist mask 412 has at least one photoresist line having a pair of sidewalls 424 ending at a line end 420. To provide the patterned photoresist mask, a photoresist layer may be first formed over the layer to be etched. Then the photoresist layer is patterned to form photoresist lines with photoresist sidewalls and line ends. The photoresist features may have a width $S_e$, as shown.

Figure 4B:
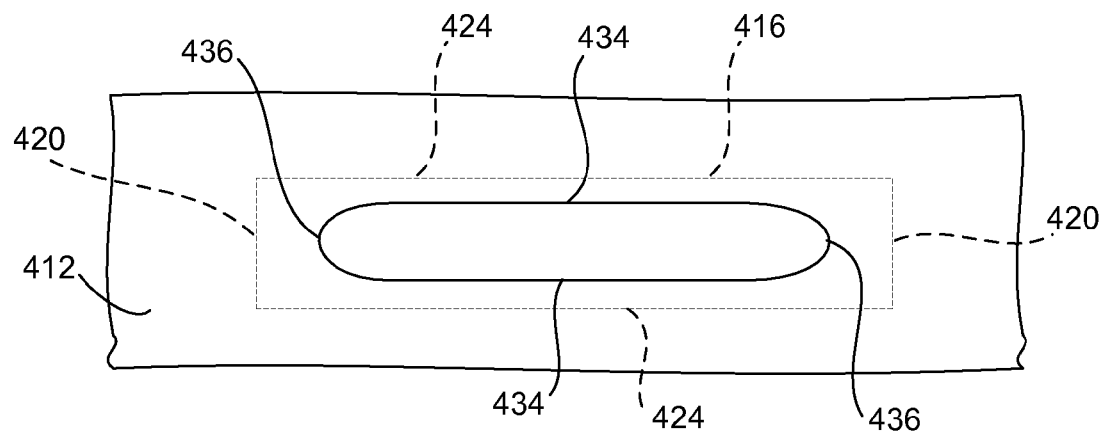

FIG. 4B is a top view of the photoresist mask 412. As discussed above, manufacturing processes, such as lithography, results in LES of the printed image. The dotted lines 416 illustrate the printed pattern provided for the photoresist mask 412. The actual etched image may have sidewalls 434 and line ends 436 that are shortened, as illustrated.

The underlayer 410 may be any known organic, inorganic, or metal layer. For exemplary purposes and not intended to be limiting, the underlayer may be an anti-reflective layer (ARL), bottom anti-reflective coating (BARC), dielectric anti-reflective coating (DARC), amorphous carbon, hard mask such as $Si_xO_y$, $Si_xN_y$, $Si_xO_yN_z$, or any other known underlayers.

A coating may be placed over the photoresist mask (step 308). FIG. 5 is a more detailed flow chart of this step. As shown in FIG. 5, the reduction of LES comprises at least one cycle of a cyclic process comprising the steps of depositing a polymer layer 504 and hardening the polymer layer 508. The photoresist lines may be coated or deposited with a polymer layer so that spaces between the photoresist features 412 have widths "$S_p$" that are less than the widths "$S_e$" of the photoresist features, before the etch and coating of the polymer layer, as shown in FIG. 4C, which is a cross-sectional view of the stack after the photoresist lines are coated with the polymer layer.

Figure 4C:
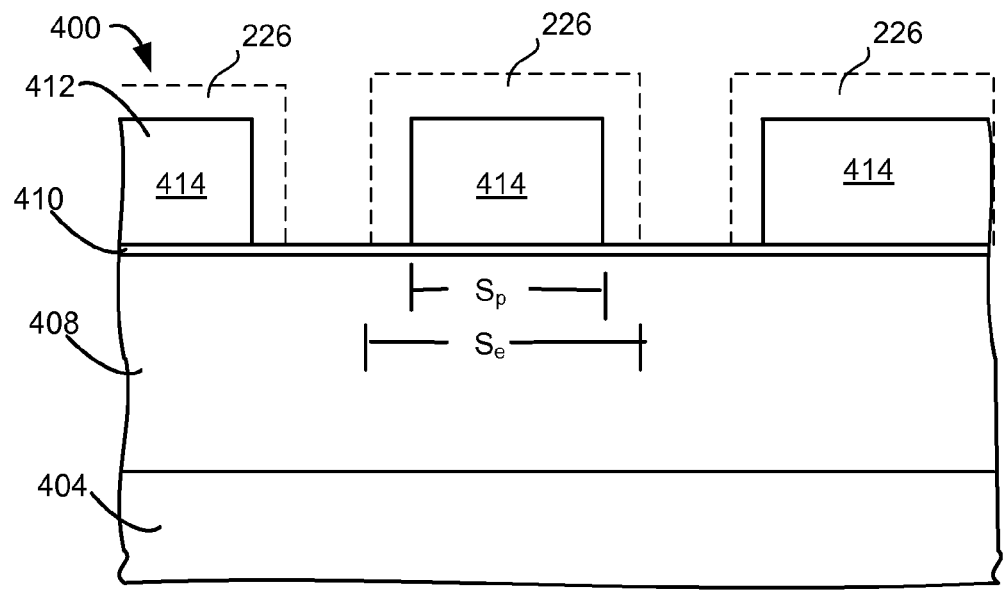
Figure 4D:
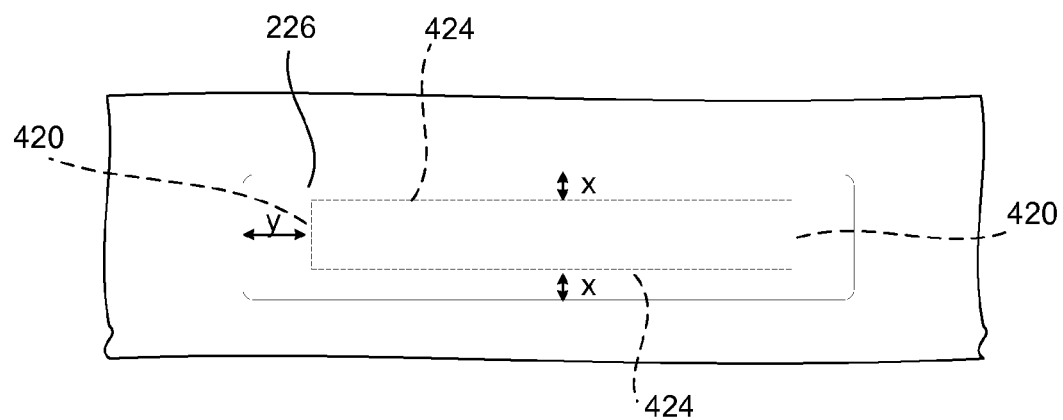
Figure 5:
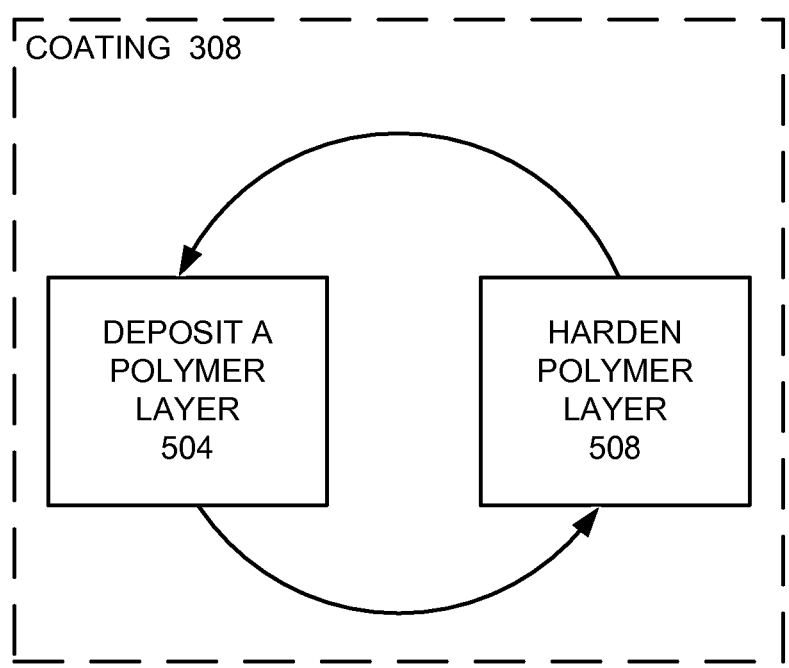
FIG. 5 is a more detailed flow chart of a step of reducing line end shortening.

FIG. 4D is a top view of the photoresist mask 412 of FIG. 4C with the photoresist line coated with the polymer layer 226. The polymer layer 226 coats the photoresist line to protect the line ends 420 and sidewalls 424 during etching such that the LES ratio is equal to or less than 1. The coating reduces LES to increase the length and width of the photoresist line. As illustrated, the amount of polymer deposited at the line end 420, y, is greater than the amount of polymer deposited on the sidewalls 424, x, since shrinkage occurs to a greater degree at the line ends 420 than at the sidewalls 424. In one embodiment, it is preferable that the amount of coating deposited at the line ends be three times as much as the amount deposited on the sidewalls. Those of ordinary skill in the art will now realize that the amount of coating deposited may to obtain an LES of less than 1.

The polymer layer may contain a carbon, hydrogen, fluorine, or a combination thereof. The gases used may be a hydrocarbon such as methane ($CH_4$), fluorocarbon, hydrofluorocarbon, helium, argon, or a combination thereof. The fluorocarbon may have a chemical formula $C_4F_8$. Preferably, the fluorocarbon has a chemical formula $C_xH_yF_z$. The process of depositing the polymer over the photoresist mask may take between about 1 to 20 seconds.

The polymer may be hardened with a mixture of fluorocarbon and a hydrogen bromide gas. Preferably, the fluorocarbon may be $CF_4$. The cyclic process may be repeated until the desired layer is achieved. It is preferable that the cycle be repeated no more than 10 times, preferably at least one time.

Figure 4E:
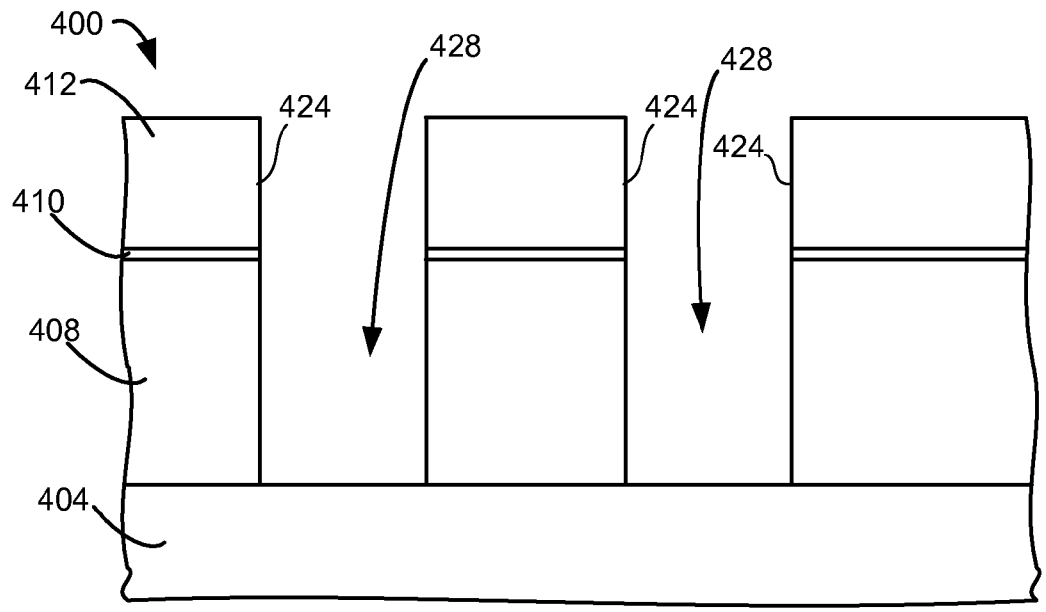
Figure 4F:
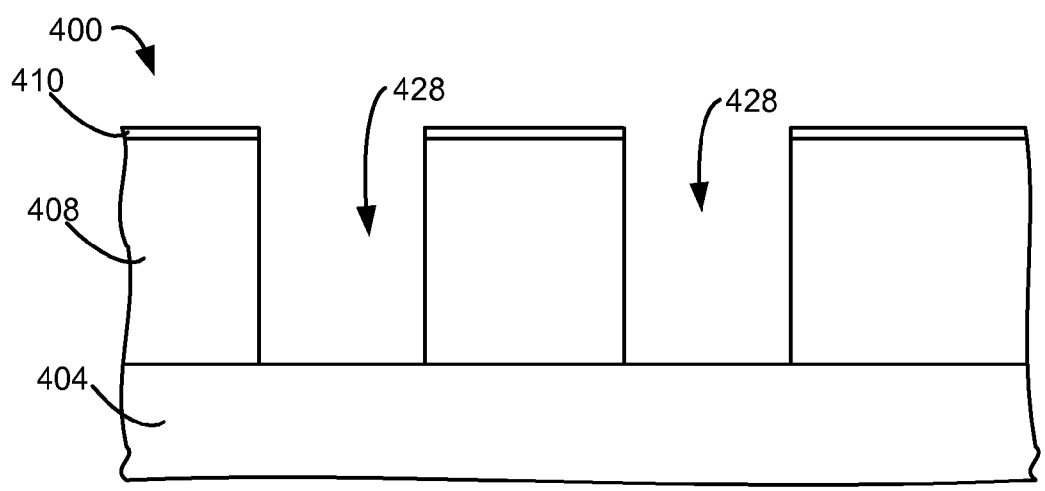

Features 428 may then be etched into the etch layer 408 through the photoresist mask 412 (step 316), as shown in FIG. 4E. A portion or all of the polymer coating 226 may also be removed during this step, thereby protecting the line ends and sidewalls to reduce the amount of LES such that the LES ratio is equal to or less than 1. The photoresist mask 412 is then removed (step 320), as shown in FIG. 4F.

EXAMPLE

In an example of this process, a patterned photoresist layer is formed (step 304). A substrate 404, with the etch layer 408, an underlayer 410, and a patterned photoresist mask 412 is placed in an etch chamber.

Figure 6:
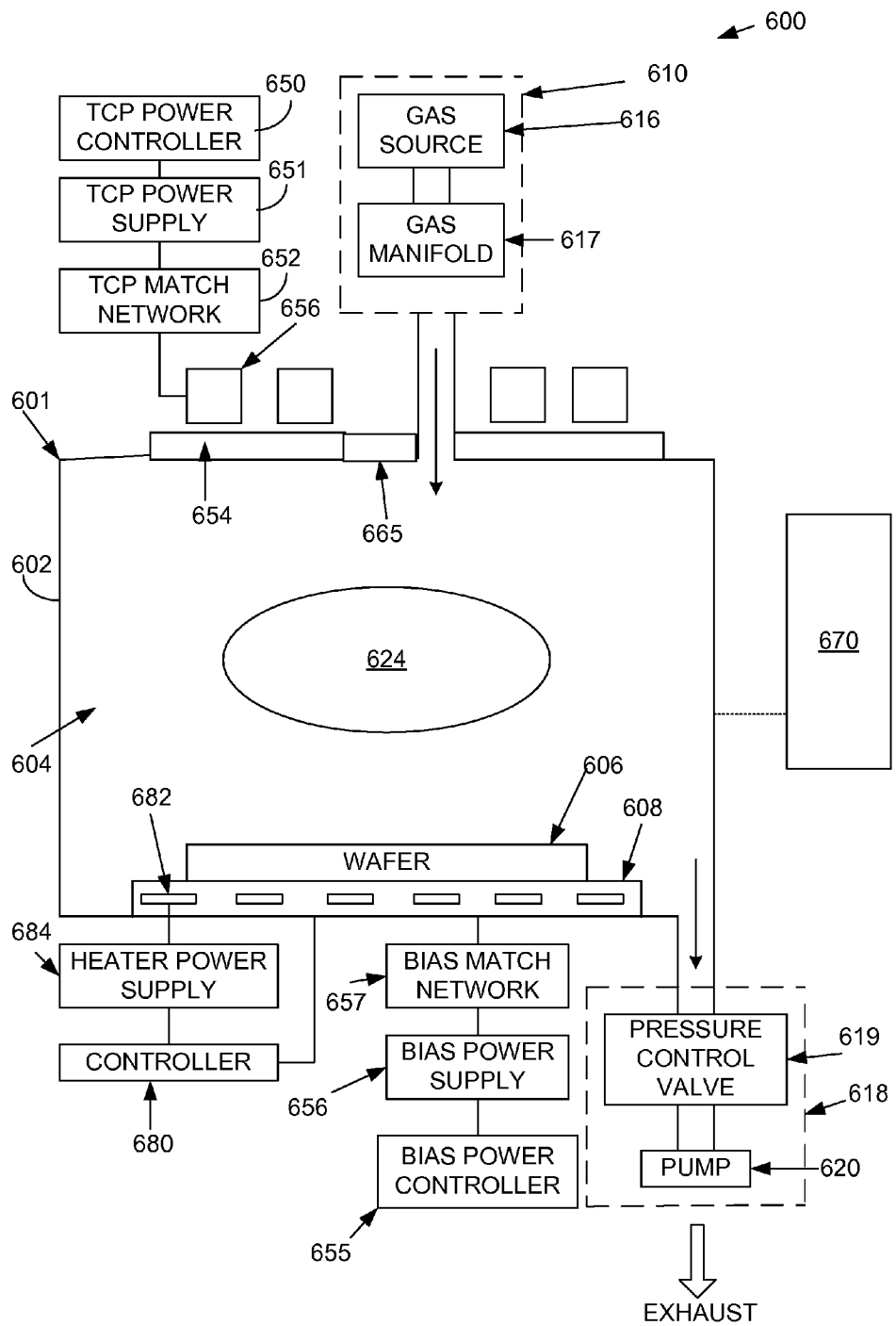
FIG. 6 is a schematic view of a plasma processing chamber that may be used in practicing the invention.

FIG. 6 is a schematic view of an processing chamber 600 that may be used for placing a polymer layer over a photoresist mask, hardening the polymer layer, etching, and stripping. Plasma processing system 600 may include a plasma processing tool 601. The plasma processing tool 601 is an inductively coupled plasma etching tool and includes a plasma reactor 602 having a plasma processing chamber 604 therein. A transformer coupled power (TCP) controller 650 and a bias power controller 655, respectively, control a TCP power supply 651 and a bias power supply 656 influencing the plasma 624 created within plasma chamber 604.

The TCP power controller 650 sets a set point for TCP power supply 651 configured to supply a radio frequency signal at 16.56 MHz, tuned by a TCP match network 652, to a TCP coil 656 located near the plasma chamber 604. An RF transparent window 654 is provided to separate TCP coil 656 from plasma chamber 604 while allowing energy to pass from TCP coil 656 to plasma chamber 604. An optically transparent window 665 may be provided by a circular piece of sapphire having a diameter of approximately 2.5 cm (1 inch) located in an aperture in the RF transparent window 654.

The bias power controller 655 sets a set point for bias power supply 656 configured to supply an RF signal, tuned by bias match network 657, to a chuck electrode 608 located within the plasma chamber 604 creating a direct current (DC) bias above electrode 608 which is adapted to receive a substrate 606, such as a semi-conductor wafer work piece, being processed.

A gas supply mechanism or gas source 610 includes a source or sources of gas or gases 616 attached via a gas manifold 617 to supply the proper chemistry required for the process to the interior of the plasma chamber 604. A gas exhaust mechanism 618 includes a pressure control valve 619 and exhaust pump 620 and removes particles from within the plasma chamber 604 and maintains a particular pressure within plasma chamber 604.

A temperature controller 680 controls the temperature of heaters 682 provided within the chuck electrode 608 by controlling a heater power supply 684. The plasma processing system 600 also includes electronic control circuitry 670.

Figure 7A:
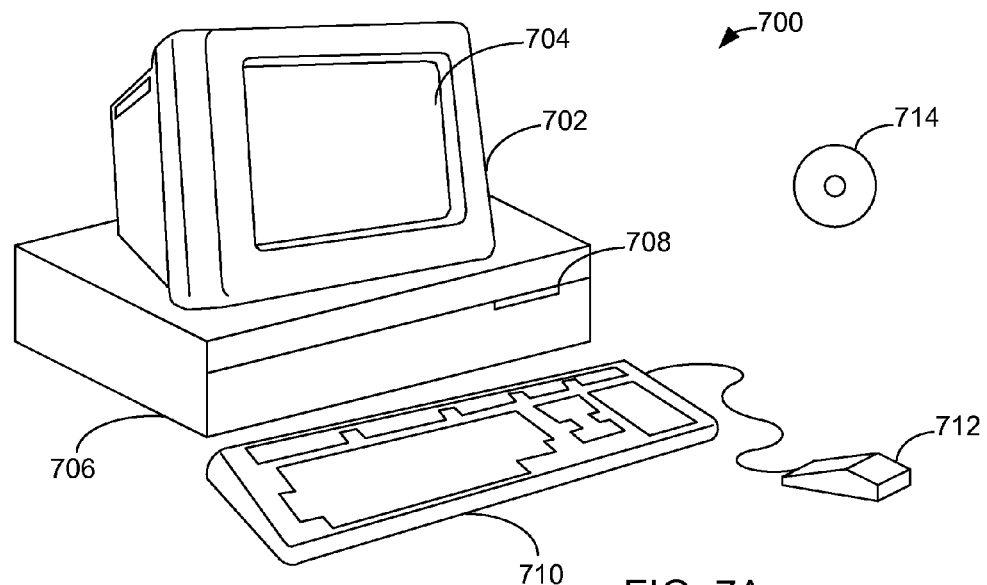
FIGS. 7A-B illustrate a computer system, which is suitable for implementing a controller used in embodiments of the present invention.
Figure 7B:
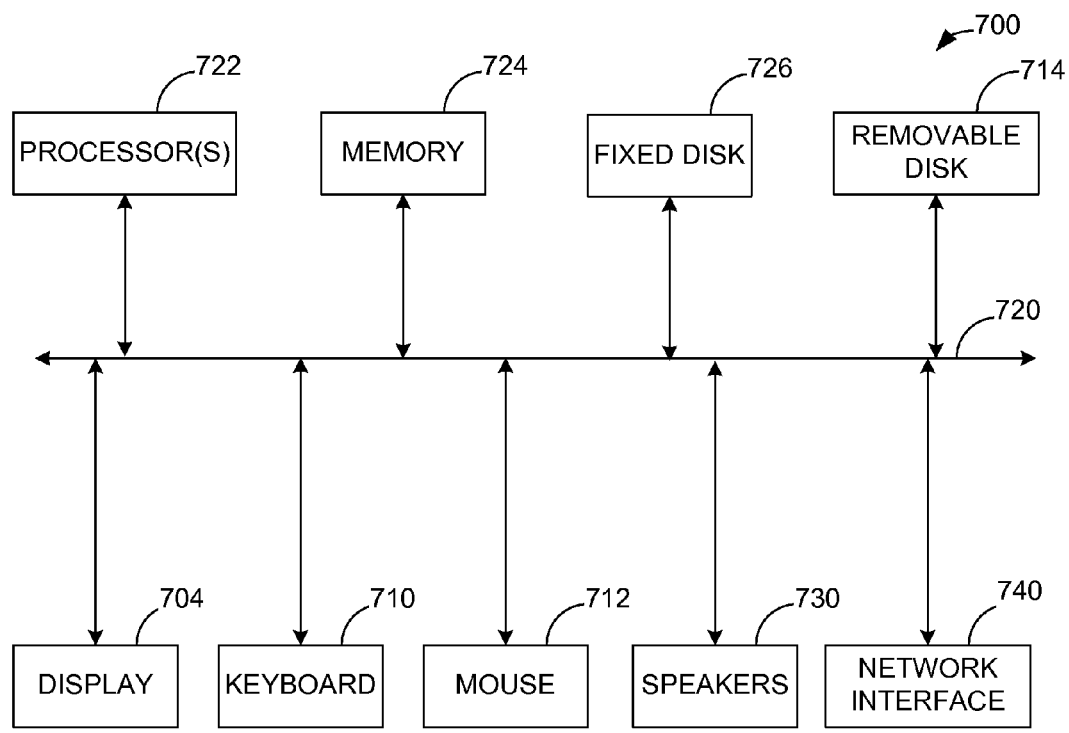

FIGS. 7A and 7B illustrate a computer system 700, which is suitable for implementing a controller 635 used in embodiments of the present invention. FIG. 7A shows one possible physical form of the computer system. Of course, the computer system may have many physical forms ranging from an integrated circuit, a printed circuit board, and a small handheld device up to a huge super computer. Computer system 700 includes a monitor 702, a display 704, a housing 706, a disk drive 708, a keyboard 710, and a mouse 712. Disk 714 is a computer-readable medium used to transfer data to and from computer system 700.

FIG. 7B is an example of a block diagram for computer system 700. Attached to system bus 720 is a wide variety of subsystems. Processor(s) 722 (also referred to as central processing units, or CPUs) are coupled to storage devices, including memory 724. Memory 724 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 726 is also coupled bi-directionally to CPU 722; it provides additional data storage capacity and may also include any of the computer-readable media described below. Fixed disk 726 may be used to store programs, data, and the like and is typically a secondary storage medium (such as a hard disk) that is slower than primary storage. It will be appreciated that the information retained within fixed disk 726 may, in appropriate cases, be incorporated in standard fashion as virtual memory in memory 724. Removable disk 714 may take the form of any of the computer-readable media described below.

CPU 722 is also coupled to a variety of input/output devices, such as display 704, keyboard 710, mouse 712, and speakers 730. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 722 optionally may be coupled to another computer or telecommunications network using network interface 740. With such a network interface, it is contemplated that the CPU might receive information from the network, or might output information to the network in the course of performing the above-described method steps. Furthermore, method embodiments of the present invention may execute solely upon CPU 722 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

A polymer layer is placed over the photoresist mask (step 308). Using multiple cycles of the cycle shown in FIG. 5, an example recipe of depositing a polymer layer (step 504) would use, for example, a gas of at least one of $CH_4$, $C_4F_8$, and $C_xH_yF_z$. An etch chamber or plasma processing chamber may have a pressure of 1-100 mT. More preferably, the pressure for laterally etching the mask is between 2-8 mT. 500 to 1000 Watts of power are supplied to the plasma processing chamber at 13.56 MHz. The temperature may be between about 40° C.-60° C. In one embodiment of a recipe, 20 sccm $CH_4$ and 100 sccm of He is used at a temperature of 40° C. for 15 seconds at a pressure of 5 mT, 500 Watts of power, and zero bias power.

The plasma layer is hardened (step 508). An example recipe for the hardening of the polymer layer provides a fluorocarbon and hydrogen bromide containing gas, such as 100 sccm $CF_4$ and 25 sccm HBr. A pressure of 5 mTorr is provided to the chamber. The second RF source 448 provides 500 Watts at a frequency of 13.56 MHz and a temperature of 40° C.

Features are then etched into the etch layer (step 316). In this example, the etch layer is a polysilicon for forming a gate. In other embodiments, the layer to be etched may be a conventional etch layer, such as SiN, SiC, an oxide, a metal layer, or low-k dielectric. A conventional etch recipe may be used to etch the layer to be etched.

To remove the mask (step 320) an oxygen ashing may be used.

In a preferred embodiment of the invention, the placement of the polymer layer, hardening of the polymer layer, and etching the features into the etch layer are done in situ in the same etch chamber, as shown. Preferably, the placement and hardening of the polymer layer is performed over less than ten cycles. More preferably, the placement and hardening of the polymer layer is performed over at least one cycle.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

The invention claimed is:

1. An apparatus for etching a feature in an etch layer, below a photoresist mask, having at least one photoresist line having a pair of sidewalls ending at line ends, wherein the at least one photoresist line extends from one line end of the line ends to another line end of the line ends, comprising:
 a plasma processing chamber, comprising:
  a chamber wall forming a plasma processing chamber enclosure;
  a substrate support for supporting a substrate within the plasma processing chamber enclosure;
  a pressure regulator for regulating the pressure in the plasma processing chamber enclosure;
  at least one electrode for providing power to the plasma processing chamber enclosure for sustaining a plasma;
  a gas inlet for providing gas into the plasma processing chamber enclosure; and
  a gas outlet for exhausting gas from the plasma processing chamber enclosure;
 a gas source in fluid connection with the gas inlet, comprising:
  a polymer deposition gas source;
  a hardening gas source; and
  an etch layer etch gas source; and
 a controller controllably connected to the gas source and the at least one electrode, comprising:
  at least one processor; and
  non-transitory computer readable media, comprising:
   computer readable code for reducing the shrinkage of the sidewalls and the line ends of the photoresist line, comprising at least one cycle, wherein each cycle comprises:
    computer readable code for depositing a polymer layer over the photoresist line, wherein an amount of polymer on the line ends is greater than an amount of polymer on the sidewalls;
    computer readable code for hardening the polymer layer;
    computer readable code for etching the etch layer, wherein a line end shortening (LES) is less than or equal to 1, wherein the LES is defined as a ratio between the shortening of a length of a line and a shortening of a width of the line; and
    computer readable code for removing the photoresist.

2. The apparatus of claim 1, wherein the polymer has a chemical formula $C_xH_yF_z$.

3. The apparatus of claim 1, wherein a gas forming polymer comprises at least one of a hydrocarbon, fluorocarbon, hydrofluorocarbon, or a combination thereof.

4. The apparatus of claim 3, wherein the fluorocarbon is $C_4F_8$, $CF_4$, $C_4F_6$, $CH_3F$, $CH_2F_2$, or $CHF_3$.

5. The apparatus of claim 1, wherein the hardening gas source comprises a mixture of fluorocarbon and a hydrogen bromide.

6. The apparatus of claim 5, wherein the fluorocarbon is $CF_4$.

7. The apparatus, as recited in claim 1, wherein the at least one photoresist line has a top surface furthest away from the etch layer and extending from the one line end of the line ends to the another line end of the line ends.

* * * * *